(12) United States Patent
Su

(10) Patent No.: US 8,535,440 B1
(45) Date of Patent: Sep. 17, 2013

(54) METHOD OF PROMOTING SINGLE CRYSTAL GROWTH DURING MELT GROWTH OF SEMICONDUCTORS

(75) Inventor: Ching-Hua Su, Huntsville, AL (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 828 days.

(21) Appl. No.: 12/758,169

(22) Filed: Apr. 12, 2010

(51) Int. Cl.
*C30B 11/14* (2006.01)

(52) U.S. Cl.
USPC .................................. 117/81; 117/82; 117/83

(58) Field of Classification Search
USPC ................... 117/81, 82, 83; 16/122.2
See application file for complete search history.

(56) References Cited

U.S. PATENT DOCUMENTS

| | | | |
|---|---|---|---|
| 3,849,205 A | 11/1974 | Brau et al. | |
| 3,925,108 A | 12/1975 | Woodbury et al. | |
| 4,199,397 A * | 4/1980 | Gurtler | 117/47 |
| 4,238,274 A * | 12/1980 | Chu et al. | 117/30 |
| 4,267,154 A | 5/1981 | Mueller et al. | |
| 4,545,848 A | 10/1985 | Lehoczky et al. | |
| 4,551,196 A | 11/1985 | Capper et al. | |
| 5,037,621 A | 8/1991 | Kennedy et al. | |
| 6,147,293 A * | 11/2000 | Tauchi et al. | 136/236.1 |
| 6,153,007 A * | 11/2000 | Nakata | 117/11 |

* cited by examiner

*Primary Examiner* — Bob M Kunemund
(74) *Attorney, Agent, or Firm* — Peter J. Van Bergen; James J. McGroary

(57) ABSTRACT

The method of the invention promotes single crystal growth during fabrication of melt growth semiconductors. A growth ampoule and its tip have a semiconductor source material placed therein. The growth ampoule is placed in a first thermal environment that raises the temperature of the semiconductor source material to its liquidus temperature. The growth ampoule is then transitioned to a second thermal environment that causes the semiconductor source material in the growth ampoule's tip to attain a temperature that is below the semiconductor source material's solidus temperature. The growth ampoule so-transitioned is then mechanically perturbed to induce single crystal growth at the growth ampoule's tip.

18 Claims, 1 Drawing Sheet

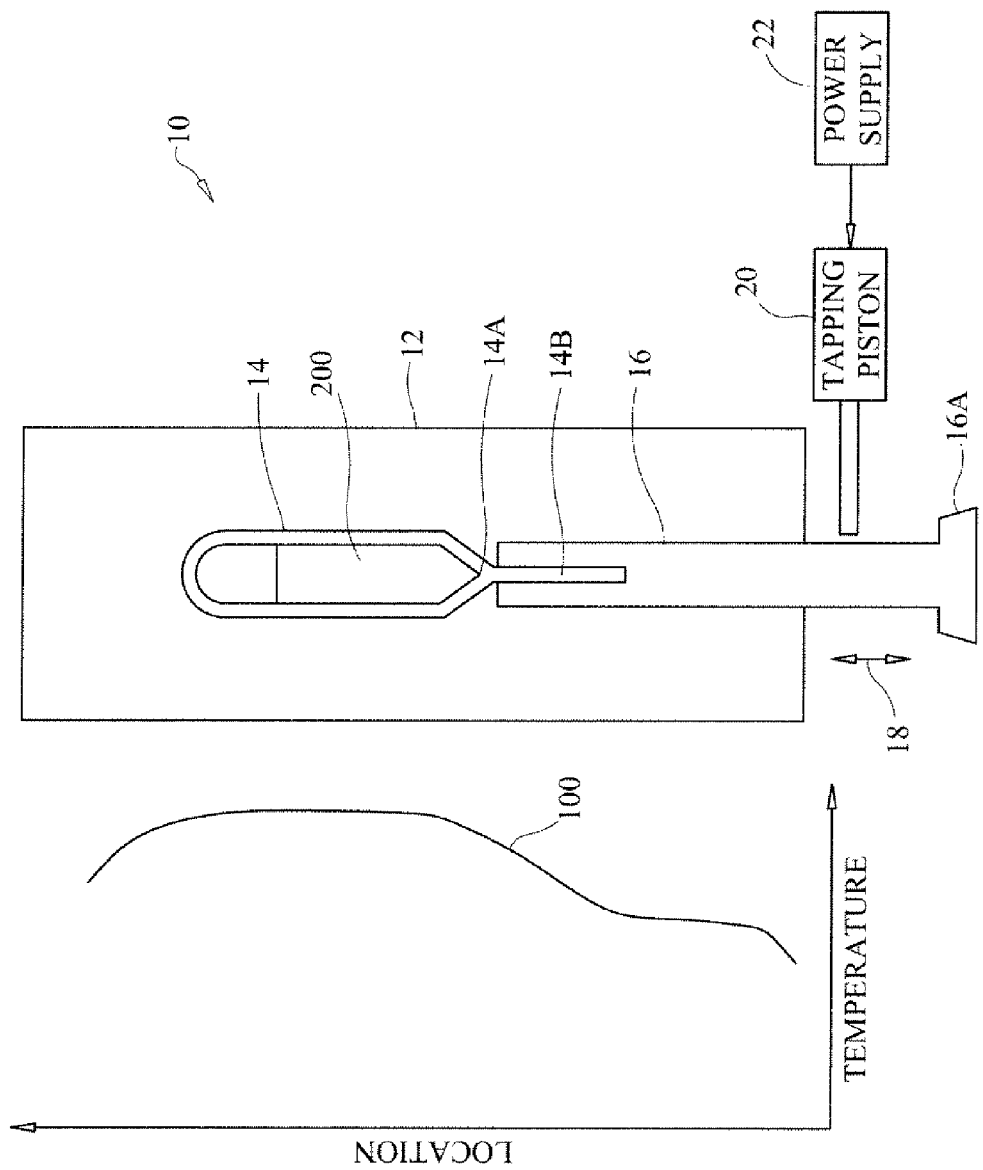

METHOD OF PROMOTING SINGLE CRYSTAL GROWTH DURING MELT GROWTH OF SEMICONDUCTORS

ORIGIN OF THE INVENTION

The invention was made by an employee of the United States Government and may be manufactured and used by or for the Government for governmental purposes without the payment of any royalties.

BACKGROUND OF THE INVENTION

1. Field of the Invention

This invention relates to melt growth of semiconductors. More specifically, the invention is a method for promoting single crystal growth during fabrication of melt growth semiconductors.

2. Description of the Related Art

Some semiconductors are melted prior to the growth of crystals therefrom. Typically, the semiconductor material is placed in an ampoule that is then heated in a furnace whereby the semiconductor melts. During cooling, crystal growth originates at the ampoule's tip. Existing bulk crystal growth apparatus/techniques (e.g., the Bridgman technique) tend to generate poor quality multi-grained crystals as the melted semiconductor undergoes supercooling. That is, the supercooling prohibits the ideal crystal growth condition in which a small single crystal nucleus forming at the ampoule's tip and subsequently grows into a large single crystal.

The large multi-grained crystal growth problem is evidenced by an analysis of melted cadmium zinc telluride semiconductor that revealed a common supercool of 40-50° C. This means that, during cooling, the melt does not solidify into a solid until it is 40-50° C. below the equilibrium solidus temperature of the material. Under a typical crystal growth process used for cadmium zinc telluride, the thermal gradient at the liquidus temperature is about 10° C. per centimeter. This implies that a solid section of about 4-5 centimeters long will be formed spontaneously at the end of supercooling. Thus, the large supercool prohibits the growth of a small single crystal nucleus that can grow into a large single crystal. Unfortunately, the real value of the cadmium zinc telluride is realized when large single crystals thereof can be fabricated.

SUMMARY OF THE INVENTION

Accordingly, it is an object of the present invention to provide a method that promotes single crystal growth during the fabrication of melt growth semiconductors.

Another object of the present invention is to provide a method that can be readily implemented with existing fabrication systems to promote single crystal growth of melt growth semiconductors.

Other objects and advantages of the present invention will become more obvious hereinafter in the specification and drawings.

In accordance with the present invention, a method is provided that promotes single crystal growth during fabrication of melt growth semiconductors. A growth ampoule has a semiconductor source material placed therein to fill the tip thereof. The growth ampoule is placed in a first thermal environment that causes the semiconductor source material to attain a liquidus temperature associated therewith. The growth ampoule is then transitioned to a second thermal environment that causes the semiconductor source material in the growth ampoule's tip to attain a temperature that is below the semiconductor source material's solidus temperature. The growth ampoule so-transitioned is then mechanically perturbed to induce single crystal growth at the growth ampoule's tip.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein:

The sole FIGURE is a schematic view of a melt growth apparatus used in implementing a method of promoting single crystal growth in accordance with the present invention.

DESCRIPTION OF THE PREFERRED EMBODIMENT(S)

A method of promoting single crystal growth during fabrication of a melt growth semiconductor will be described with the aid of the sole FIGURE where a melt growth fabrication system is shown and is referenced generally by numeral 10. Such melt growth fabrication systems are well known in the art and could be constructed in a variety of ways without departing from the scope of the present invention. Accordingly, it is to be understood that the structural features of system 10 described herein are not limitations of the present invention as the novelty thereof could be achieved using a variety of alternative constructions.

Melt growth fabrication system 10 typically includes the following features: a furnace 12, a growth ampoule 14, and a fixture 16 for supporting growth ampoule 14 in furnace 12 during the melt growth process. Furnace 12 has a known thermal profile associated therewith. That is, when furnace 12 is operated, a temperature as a function of location in furnace 12 is known. In order to facilitate an explanation of the present invention, an exemplary thermal profile 100 as a function of location in furnace 12 is shown alongside furnace 12.

Growth ampoule 14 is a container used to hold a semiconductor source material 200 therein. More specifically, growth ampoule 14 has a tip 14A formed at one end thereof that is filled with material 200. As is known in the art, growth ampoule 14 is made from a material at remains solid at the melt temperatures of material 200 and is inert with respect to material 200. A typical material used for ampoule 14 is fused silica.

Growth ampoule 14 also is equipped for support by fixture 16. For example, if fixture 16 is a tube (e.g., made from fused silica), growth ampoule 14 can have a rod 14B extending from tip 14A that fits in tubular fixture 16 as illustrated. This type of fixture support of growth ampoule 14 is well understood in the art of melt growth fabrication systems.

As mentioned above, fixture 16 supports growth ampoule 14 in furnace 12. Fixture 16 can, in turn, be supported in a base 16A. As will be explained further below, the present invention requires that growth ampoule 14 be moved relative to thermal profile 100 during processing as indicated by two-headed arrow 18. One or both of furnace 12 and fixture 16 can be moved to reposition growth ampoule 14 relative to thermal profile 100. Accordingly, furnace 12 and/or fixture 16 can be equipped to provide such movement. The particular structures or systems used to bring about such relative movement are not limitations of the present invention.

In accordance with the present invention, growth ampoule 14 is positioned in furnace 12 that is operated to heat up furnace 12 in accordance with its thermal profile 100. Specifically, thermal profile 100 must be sufficient to heat material 200 to its liquidus temperature. This condition is maintained for a selected period of time so that material 200 can attain a state of thermal equilibrium. The temperature and amount of time required for this to occur are dependent on the characteristics of material 200.

Once material 200 has had sufficient time to melt and be in thermal equilibrium, the present invention causes growth ampoule 14 to be repositioned in furnace 12 such that ampoule tip 14A is located in furnace 12 where thermal profile 100 lowers the temperature at tip 14A below the solidus temperature of material 200. At this lower temperature, crystal growth begins at tip 14A. In the illustrated example, this would mean that furnace 12 and/or fixture 16 translate such that tip 14A is located in a lower temperature region of thermal profile 100.

When tip 14A is repositioned to be at a temperature that is less than the solidus temperature of material 200, the present invention mechanically perturbs the melted material 200 to induce single crystal growth at ampoule tip 14A. In general, this means that growth ampoule 14 is shaken while in furnace 12. Such mechanical perturbation causes the solid particle sizes of material 200 to fluctuate. In homogenous nucleation, the free energy of a particle is a maximum at a critical particle radius, but then is reduced with increasing radius of the particle. In the present invention, nucleation at lower free energies is provided for by the shaking of growth ampoule 14 as such mechanical perturbation increases nucleation as the range of particle sizes increases, i.e., some particles become larger while some become smaller.

The mechanical perturbation of melted material 200 via shaking of growth ampoule 14 can be achieved in a variety of ways without departing from the scope of the present invention. For example, in the illustrated embodiment, growth ampoule 14 is shaken when fixture 16 is mechanically and repetitively tapped by a tapping piston 20 that can be located outside of furnace 12 as illustrated. Tapping piston 20 can be a simple AC powered vibrator, a variety of which are commercially available. In such a case, a power supply 22 is coupled to tapping piston 20. Tapping piston 20 is configured and operated to tap on fixture 16 when tip 14A is below the solidus temperature of material 200. The frequency duration of the tapping and the temperature where tapping begins/finishes are predicated on the characteristic of material 200.

By way of example, the present invention will be explained for the semiconductor material cadmium zinc telluride. It is expected that similar results can be achieved for other ternary systems such as mercury zinc telluride and binary systems such as cadmium telluride. Applying the above-described operational steps, good single crystal growth resulted when (i) the ampoule tip was repositioned so that the temperature thereof was 3-8° C. below the solidus temperature of cadmium zinc telluride, (ii) the tapping frequency was approximately 60 Hz (i.e., low enough not to disturb the melt), and (iii) the tapping duration lasted for approximately 15-25 seconds.

Several growth experiments were performed with the same growth conditions and procedures except that mechanical tapping was employed for some of the runs but not for the other runs. The crystalline quality showed that the crystals grown without the mechanical tapping were usually multi-grained at the beginning of the growth as well as throughout the ingot formed in the ampoule, whereas the crystals grown with the mechanical tapping were mostly single nucleation at the ampoule tip and continued to grow as single crystal throughout the ingot.

The advantages of the present invention are numerous. Mechanical perturbation of a growth ampoule during supercooling of a melt growth semiconductor has resulted in single crystal nucleation and growth at the ampoule tip. Such mechanical perturbation can be achieved by simple mechanical tapping on the fixture supporting the growth ampoule. Thus, the method of the present invention can be readily adapted and implemented on existing melt growth fabrication systems.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method of promoting single crystal growth during fabrication of melt growth semiconductors, comprising the steps of:
    providing a growth ampoule having a growth ampoule body and a growth ampoule tip;
    placing a semiconductor source material in said growth ampoule body to fill said growth ampoule tip;
    placing said growth ampoule in a first thermal environment that causes said semiconductor source material to attain a liquidus temperature associated therewith;
    transitioning said growth ampoule to a second thermal environment that causes said semiconductor source material in said growth ampoule tip to attain a temperature that is below a solidus temperature of said semiconductor source material; and
    mechanically perturbing said growth ampoule so-transitioned to induce single crystal growth at said growth ampoule tip.

2. A method according to claim 1, wherein said semiconductor source material is cadmium zinc telluride, and wherein said step of mechanically perturbing comprises the step of shaking said growth ampoule at a frequency of approximately 60 Hz for approximately 15-25 seconds when said temperature that is below said solidus temperature is approximately 3-8° C. below said solidus temperature of said semiconductor source material.

3. A method according to claim 1, wherein said semiconductor material is selected from the group consisting of cadmium zinc telluride, mercury zinc telluride and cadmium telluride.

4. A method according to claim 1, wherein said step of placing said growth ampoule in said first thermal environment includes the steps of:
    providing a furnace having a thermal profile that is known;
    positioning said growth ampoule body at a first location in said furnace, wherein said thermal profile at said first location provides for said first thermal environment; and
    maintaining said growth ampoule at said first location for a period of time based on characteristics of said semiconductor source material.

5. A method according to claim 4, wherein said step of transitioning comprises the step of moving at least one of said growth ampoule and said furnace to reposition said growth ampoule at a second location in said furnace, wherein said thermal profile at said second location provides for said second thermal environment.

6. A method according to claim 1, wherein said steps of placing said growth ampoule in said first thermal environment and transitioning include the step of providing a fixture for supporting said growth ampoule.

7. A method according to claim 6, wherein said step of mechanically perturbing comprises the step of mechanically tapping on said fixture.

8. A method of promoting single crystal growth during fabrication of melt growth semiconductors, comprising the steps of:
   providing a melt growth apparatus that includes a furnace with a thermal profile defining operating temperature characteristics of said furnace as a function of location in said furnace, said melt growth apparatus further including a fixture for supporting a growth ampoule in said furnace at a selected location therein, said growth ampoule having a growth ampoule body and a growth ampoule tip;
   placing a semiconductor source material in said growth ampoule body to fill said growth ampoule tip;
   operating said furnace to achieve said thermal profile;
   positioning said growth ampoule in said furnace using said fixture wherein said growth ampoule body resides at a first location in said furnace where said thermal profile will raise the temperature of said semiconductor source material therein to a liquidus temperature thereof;
   moving at least one of said furnace and said growth ampoule such that said growth ampoule tip resides at a second location in said furnace where said thermal profile reduces a temperature of said semiconductor source material so-filling said growth ampoule tip to below a solidus temperature of said semiconductor source material; and
   tapping on said fixture following said step of moving to induce single crystal growth at said growth ampoule tip.

9. A method according to claim 8, wherein said semiconductor source material is cadmium zinc telluride, and wherein said step of tapping is carried out at a frequency of approximately 60 Hz for approximately 15-25 seconds when said temperature so-reduced is approximately 3-8° C. below said solidus temperature of said semiconductor source material.

10. A method according to claim 8, wherein said semiconductor material is selected from the group consisting of cadmium zinc telluride, mercury zinc telluride and cadmium telluride.

11. A method according to claim 8, wherein said step of positioning includes the step of maintaining said growth ampoule at said first location for a period of time based on characteristics of said semiconductor source material.

12. A method of promoting single crystal growth during fabrication of melt growth semiconductors, comprising the steps of:
   providing a growth ampoule having a growth ampoule body and a growth ampoule tip;
   placing a semiconductor source material in said growth ampoule body to fill said growth ampoule tip;
   immersing said growth ampoule in a first thermal environment that raises and maintains said semiconductor source material to a liquidus temperature associated therewith for a selected period of time;
   transitioning said growth ampoule to a second thermal environment after said selected period of time is concluded, said second thermal environment causing said semiconductor source material in said growth ampoule tip to attain a temperature that is below a solidus temperature of said semiconductor source material; and
   shaking said growth ampoule so-transitioned to induce single crystal growth at said growth ampoule tip.

13. A method according to claim 12, wherein said semiconductor source material is cadmium zinc telluride, and wherein said step of shaking comprises the step of shaking said growth ampoule at a frequency of approximately 60 Hz for approximately 15-25 seconds when said temperature that is below said solidus temperature is approximately 3-8° C. below said solidus temperature of said semiconductor source material.

14. A method according to claim 12, wherein said semiconductor material is selected from the group consisting of cadmium zinc telluride, mercury zinc telluride and cadmium telluride.

15. A method according to claim 12, wherein said step of immersing includes the steps of:
   providing a furnace having a thermal profile that is known;
   positioning said growth ampoule body at a first location in said furnace, wherein said thermal profile at said first location provides for said first thermal environment; and
   maintaining said growth ampoule at said first location for said selected period of time based on characteristics of said semiconductor source material.

16. A method according to claim 15, wherein said step of transitioning comprises the step of moving at least one of said growth ampoule and said furnace to reposition said growth ampoule at a second location in said furnace, wherein said thermal profile at said second location provides for said second thermal environment.

17. A method according to claim 16, wherein said steps of immersing and transitioning include the step of providing a fixture for supporting said growth ampoule in said furnace.

18. A method according to claim 17, wherein said step of shaking comprises the step of mechanically tapping on said fixture.

* * * * *